United States Patent
Lee

(10) Patent No.: US 7,460,403 B2
(45) Date of Patent: Dec. 2, 2008

(54) FLASH MEMORY DEVICES AND METHODS OF OPERATING THE SAME

(75) Inventor: Jin-Yub Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 24 days.

(21) Appl. No.: 11/606,283

(22) Filed: Nov. 30, 2006

(65) Prior Publication Data
US 2008/0094902 A1   Apr. 24, 2008

(30) Foreign Application Priority Data
Oct. 20, 2006   (KR) ...................... 10-2006-0102272

(51) Int. Cl.
*G11C 11/34* (2006.01)
*G11C 16/04* (2006.01)

(52) U.S. Cl. ............................ 365/185.17; 365/185.23; 365/185.33; 365/230.06

(58) Field of Classification Search ............ 365/185.17, 365/185.23, 185.33, 230.06
See application file for complete search history.

(56) References Cited

U.S. PATENT DOCUMENTS

| | | | |
|---|---|---|---|
| 6,809,365 B2 * | 10/2004 | Nakamura et al. | 257/298 |
| 6,987,694 B2 * | 1/2006 | Lee | 365/185.17 |

2006/0274564 A1* 12/2006 Kim .......................... 365/100

FOREIGN PATENT DOCUMENTS

| | | |
|---|---|---|
| KR | 100161410 | 8/1998 |
| KR | 100164354 | 9/1998 |
| KR | 10-0349355 | 8/2002 |
| KR | 10-2002-0094502 A | 12/2002 |

OTHER PUBLICATIONS

Korean Office Action (dated Nov. 26, 2007) for counterpart Korean Patent Application 10-2006-0102272 is provided for the purposes of certification under 37 C.F.R. §§ 1.97(e).

* cited by examiner

*Primary Examiner*—Richard Elms
*Assistant Examiner*—Toan Le
(74) *Attorney, Agent, or Firm*—Harness, Dickey & Pierce, P.L.C.

(57) ABSTRACT

A memory cell array includes a NAND string formed of a plurality of memory cells coupled in series between a string selection transistor and a ground selection transistor. The string selection transistor controls an electrical connection between the NAND string and a bit line based on a string selection voltage in a read operation. A row selection circuit is coupled to the memory cell array through a string selection line, ground selection line and a plurality of word lines. The row selection circuit selects a word line which is coupled to the read memory cell among the plurality of word lines based on a row address signal and a read voltage in a read operation. A voltage generation circuit generates the string selection voltage and the read voltage.

21 Claims, 8 Drawing Sheets

FLASH MEMORY DEVICES AND METHODS OF OPERATING THE SAME

PRIORITY STATEMENT

This non-provisional U.S. patent application claims priority under 35 USC § 119 to Korean Patent Application No. 10-2006-0102272, filed on Oct. 20, 2006, in the Korean Intellectual Property Office (KIPO), the entire contents of which is incorporated herein by reference.

BACKGROUND

Description of the Related Art

Conventional semiconductor memory devices may be volatile or non-volatile memory devices according to whether the memory devices retain stored data when power is turned off. Non-volatile memory devices include, for example, electrically erasable and programmable read only memory (EEPROM).

Conventional EEPROMs have three operating modes: a program mode for writing data to a memory cell, a read mode for reading stored data and an erase mode for erasing the stored data.

A conventional flash memory device may be an EEPROM and may simultaneously perform an erase operation in units of blocks or sectors. Conventional flash memory devices may be NAND-type flash memory devices or NOR-type flash memory devices, according to the structure of the memory cell array included therein. In a NAND-type flash memory device, cell transistors are connected to each other in series between a bit line and a ground electrode. In a NOR-type flash memory device, cell transistors are connected in parallel between a bit line and a ground electrode.

In a NAND-type flash memory device, data access at the byte level in read and program modes may be relatively difficult (e.g., impossible); however, a NAND-type flash memory device may have higher or relatively high program and/or erase operating speeds.

FIG. 1 is a block diagram illustrating a conventional flash memory device. Referring to FIG. 1, the flash memory device 100 may include a memory cell array 110, a row selection circuit 120, a read voltage generator 130, a page buffer block 140, a column selection circuit 150 and a controller 160.

The memory cell array 110 may include a plurality of NAND strings extending in a column direction. Each of the plurality of NAND strings includes a plurality of memory cells coupled in series between a string selection transistor and a ground selection transistor. The memory cells included in respective NAND strings may be coupled to one of word lines WL1 through WLm. A drain of each string selection transistor may be coupled to a corresponding one of bit lines BL1 through BLn. The bit lines BL1 through BLn extend in a column direction. A source of each ground selection transistor may be coupled to a common source line (CSL).

The row selection circuit 120 may be coupled to the memory cell array 110 through a string selection line (SSL), a ground selection line (GSL) and a plurality of word lines WL1 through WLm. In an example read operation, the row selection circuit 120 selects one of the plurality of word lines WL1 through WLm coupled to a read memory cell based on a row address signal ADDX and a read voltage VREAD. The read voltage generator 130 may include a charge pump and may generate the read voltage VREAD by increasing a power voltage.

The page buffer block 140 may include a plurality of page buffers (or page resistors) coupled between the bit lines BL1 through BLn and the column selection circuit 150. Each page buffer may include a precharge unit and a sense amplifier. Each page buffer may determine whether a memory cell coupled to a selected word line has been programmed by sensing a bit line voltage during a read operation. The column selection circuit 150 may select a bit line coupled to a memory cell to be programmed or to be read in response to a column address ADDY. The read operation of the flash memory device 100 may be controlled by the controller 160.

FIG. 2 is a circuit diagram of conventional NAND string. A conventional read operation of the flash memory device in FIG. 1 will be described with respect to the circuit diagram in FIG. 2.

The read operation of NAND-type flash memory device may be performed in a unit of a page, and data (e.g., data that is programmed or erased state) of memory cells coupled to a selected word line in a selected block may be read by the page buffer circuit sensing the bit line voltage. The read data may be stored in respective latches of the page buffer and then sequentially output to a data line. The memory cells may be divided into on-cells (erased cells) and off-cells (programmed cells) according to whether the memory cell is programmed. The off-cell is a memory cell having a higher (e.g., a high or relatively high) threshold voltage because electrons are injected to a floating gate of the memory cell transistor, whereas the on-cell is a memory cell having a lower (e.g., a low or relatively low) threshold voltage because the on-cell remains erased.

To describe an example read operation, only two NAND strings of the memory cell array 110 are shown in FIG. 2. A read memory cell CT21 coupled to a selected word line WL2 may be a programmed off-cell and a read memory cell CT22 coupled to the same word line WL2 is a non-programmed (e.g., erased) on-cell.

To read data (e.g., whether programmed or not) stored in the read memory cell CT21 and CT22, for example, 0V may be applied to the selected word line WL2 coupled to the read memory cells CT21 and CT22. Concurrently, a read voltage VREAD of 4V to 5V may be applied to unselected word lines WL1 and WLm. In addition, read voltage VREAD may be applied to a string selection line SSL coupled to a gate of the string selection transistor and a ground selection line GSL coupled to a gate of the ground selection transistor to allow a sufficient cell current to flow through the selected NAND string.

As illustrated in FIG. 2, when a read memory cell CT21 is a programmed off-cell, a transistor of the read memory cell CT21 may be turned off so that the drain is electrically separated or isolated from the source. Accordingly, a voltage of a first path 21 between the read memory cell CT21 and a common source line CSL becomes equal to a voltage of the common source line CSL (e.g., 0V). A voltage of a second path 22 between the read memory cell CT21 and bit line BL1 becomes equal to a bit line voltage (VBL1). The paths 21 and 22 are electric conduction paths including a drain, a source and a channel formed by applying a gate voltage not less than threshold voltages of cell transistors.

When the read memory cell CT22 is a non-programmed (e.g., erased) on-cell, the read memory cell CT22 may be turned on to form a channel electrically coupling the drain with the source. Accordingly, a voltage value of a third path 23 from the common source line CSL to the bit line BL2 becomes equal to a voltage of the common source line CSL (e.g., 0V).

FIG. 3 is a voltage waveform diagram for describing an example read operation of the flash memory device in FIG. 1.

Referring to FIG. 3, for example, a ground voltage of 0V may be applied to the common source line CSL. A read voltage VREAD of 4V to 5V may be applied to the unselected word line, the gates of the string selection transistor SST, the ground selection transistor GST, and 0V may be applied to the selected word line at time t1. The read voltage VREAD may be applied to gates of the string selection transistor SST and ground selection transistor GST through the string selection line SSL and the ground selection line GSL, respectively. A bit line coupled to the off-cell (BL, off-cell) may be stabilized to the bit line voltage VBL1, and a bit line coupled to on-cell (BL, on-cell) may be stabilized to a voltage level lower than the bit line voltage VBL1.

When a sensing operation begins at time t2, the second path 22 and the bit line, which may be electrically separated by the off-cell, maintain the bit line voltage VBL1, whereas the third path 23 and the bit line (BL, on-cell), which are electrically coupled to the common source line CSL by the on-cell, may decrease to 0V. Accordingly, a change of the bit line voltage may be sensed and data (e.g., whether programmed or not) stored in the read memory cell is determined or read.

As described above, when the read voltage VREAD is applied to control gates of the memory cells in a read operation, a voltage may be applied to floating gates of the memory cells causing a tunneling of electrons due to a voltage difference between the floating gate and the channel. Although the read voltage VREAD applied to a gate of the memory cell is lower than a voltage during the program operation, the memory cell may be programmed softly according to repeated read operations. Such a change of the threshold voltage due to a relatively low read voltage is called a read disturbance.

In the conventional flash memory device 100, the read voltage VREAD of, for example, 4V to 5V may be applied to the string selection transistor during a read operation, and the string selection transistor may remain on regardless of whether the read memory cell is programmed. This may increase a read disturbance. The read disturbance may change the threshold voltage of the memory cell, thereby increasing errors in a read operation.

SUMMARY

Example embodiments relate to semiconductor memory devices, for example, flash memory devices that may reduce a read disturbance and methods of reading data in flash memory devices.

At least some example embodiments provide flash memory devices that may reduce a read disturbance and a read error by inducing a boost voltage in a channel of the memory cell in a read operation.

At least some example embodiments provide methods of reading data in flash memory devices that may reduce a read disturbance and a read error by inducing a boost voltage in a channel of the memory cell in a read operation.

In at least one example embodiment, a flash memory device may include a memory cell array, a row selection circuit and/or a voltage generation circuit. The memory cell array may include at least one NAND string, each of the at least one NAND string being formed of a plurality of memory cells coupled in series between a string selection transistor and a ground selection transistor. The string selection transistor may control an electrical coupling between a first of the at least one NAND strings and a corresponding first bit line based on the string selection voltage during a read operation.

The row selection circuit may be coupled to the memory cell array through a string selection line, ground selection line and a plurality of word lines and may select a first word line from the plurality of word lines based on a row address signal and a read voltage during a read operation. The first word line may be coupled to a first read memory cell. The voltage generation circuit may generate the string selection voltage and the read voltage.

According to at least some example embodiments, the string selection transistor may be turned off to electrically separate or isolate the first NAND string from the first bit line when the read memory cell is programmed. The string selection transistor may be turned on to electrically couple the first NAND string with the first bit line when the read memory cell is not programmed.

In at least some example embodiments, the string selection voltage may be lower than the read voltage. For example, the string selection voltage may be lower than a sum of a bit line voltage for the read operation and a threshold voltage of the string selection transistor. The string selection voltage may be output to the string selection line after a delay time for stabilizing the read voltage applied to an unselected word line and the bit line voltage for a read operation. The row selection circuit may include a ground selection pass gate, a row decoder, a delay unit and/or a string selection pass gate. The ground selection pass gate may be configured to output the read voltage to the ground selection line in response to a word line enable signal. The row decoder may be configured to output a ground voltage to the first word line and output the read voltage to unselected word lines except the first word line in response to the word line enable signal and the row address signal. The delay unit may be configured to delay the word line enable signal by the delay time to output the delayed word line enable signal. The string selection pass gate may be configured to output the string selection voltage to the string selection line in response to the delayed word line enable signal.

According to at least some example embodiments, the voltage generation circuit may include a string selection voltage generator configured to generate the string selection voltage, and a read voltage generator configured to generate the read voltage. The string selection voltage generator may include a charge pump, a comparator and/or a logic unit. The charge pump may be configured to generate the string selection voltage based on a control clock signal. The comparator may be configured to generate a comparison signal based on the string selection voltage and a reference voltage, and the logic unit may be configured to output the control clock signal based on a clock signal and the comparison signal.

In a method of operating a flash memory device, according to an example embodiment, at least one NAND string, formed of a plurality of memory cells coupled in series between a string selection transistor and a ground selection transistor, may be electrically coupled to a common source line. A first word line coupled to a read memory cell may be selected among the plurality of word lines based on a row address signal and a read voltage. An electrical connection between a first of the at least one NAND string and a corresponding first bit line may be controlled based on a string selection voltage.

According to at least some example embodiments, controlling the electrical connection between the first NAND string and the first bit line may include electrically separating or isolating the first NAND string from the first bit line by turning off the string selection transistor when the read memory cell is programmed. The electrical connection between the first NAND string and the first bit line may further include electrically coupling the first NAND string with the first bit line by turning on the string selection transistor when the read memory cell is not programmed. The string selection voltage may be lower than the read voltage. For example, the string selection voltage may be lower than a sum of a bit line voltage for the read operation and a threshold voltage of the string selection transistor.

According to at least some example embodiments, controlling the electrical connection between the first NAND string and the first bit line may include outputting the string selection voltage to the string selection line after a delay time for stabilizing the read voltage applied to unselected word lines except the first word line and the bit line voltage for the read operation.

According to at least some example embodiments, controlling the electrical connection between the first NAND string and the first bit line may include outputting the string selection voltage based on a control clock signal, generating a comparison signal based on the string selection voltage and a reference voltage, and outputting the control clock signal based on a clock signal and the comparison signal.

According to at least some example embodiments, electrically coupling the first NAND string to the common source line may include applying the read voltage to a gate of the ground selection transistor in response to a word line enable signal. Selecting the word line coupled to the read memory cell may include outputting a ground voltage to the first word line based on the word line enable signal and the row address signal, and outputting the read voltage to unselected word lines except the first word line based on the word line enable signal and the row address signal. In at least this example embodiment, controlling the electrical connection between the first NAND string and the first bit line may include delaying the word line enable signal by a delay time for stabilizing the read voltage applied to unselected word lines except the first word line and a bit line voltage for the read operation and applying the string selection voltage to a gate of the string selection transistor in response to the delayed word line enable signal.

According to at least some example embodiments, a read disturbance and data read error may be reduced by turning off a string selection transistor in a read operation of a programmed off-cell, thereby inducing a boost voltage in a channel of the memory cell.

DETAILED DESCRIPTION OF EXAMPLE EMBODIMENTS

Figure 1:
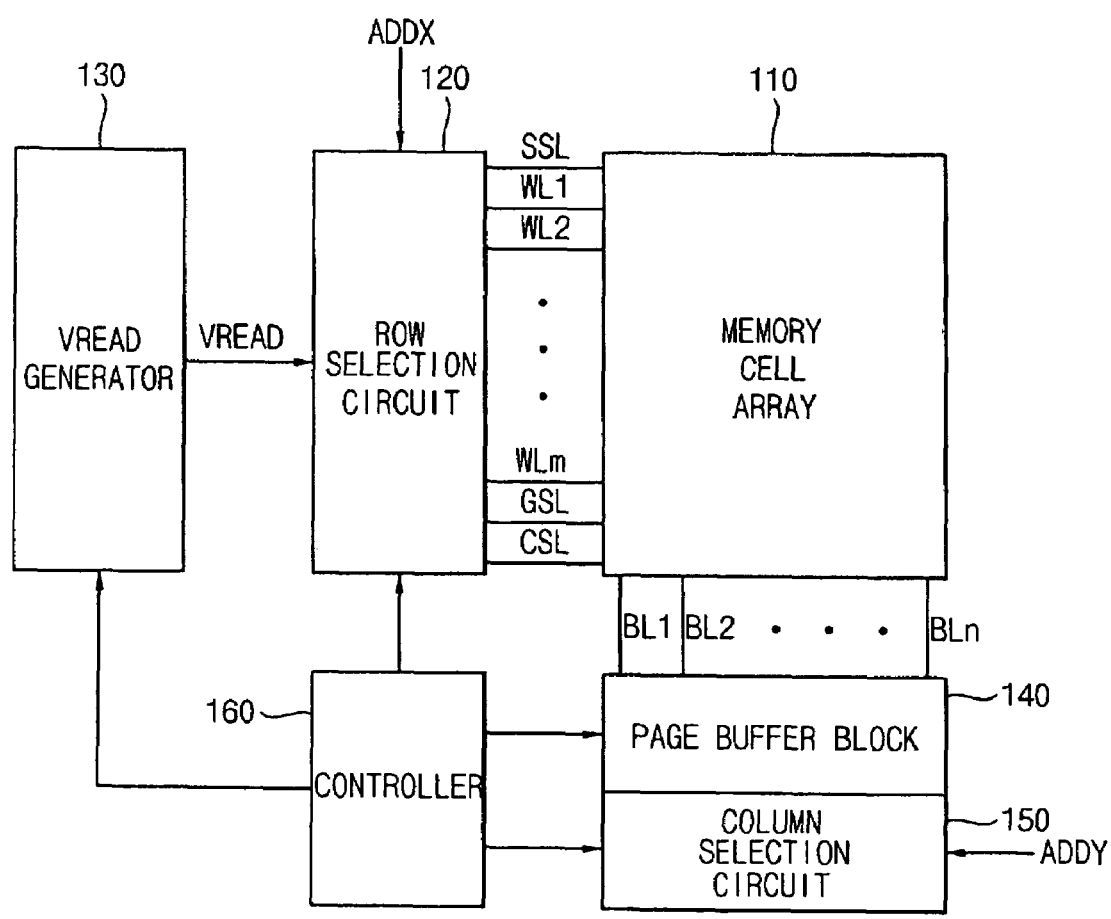
FIG. 1 is a block diagram illustrating a conventional flash memory device.

Example embodiments now will be described more fully with reference to the accompanying drawings. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 4:
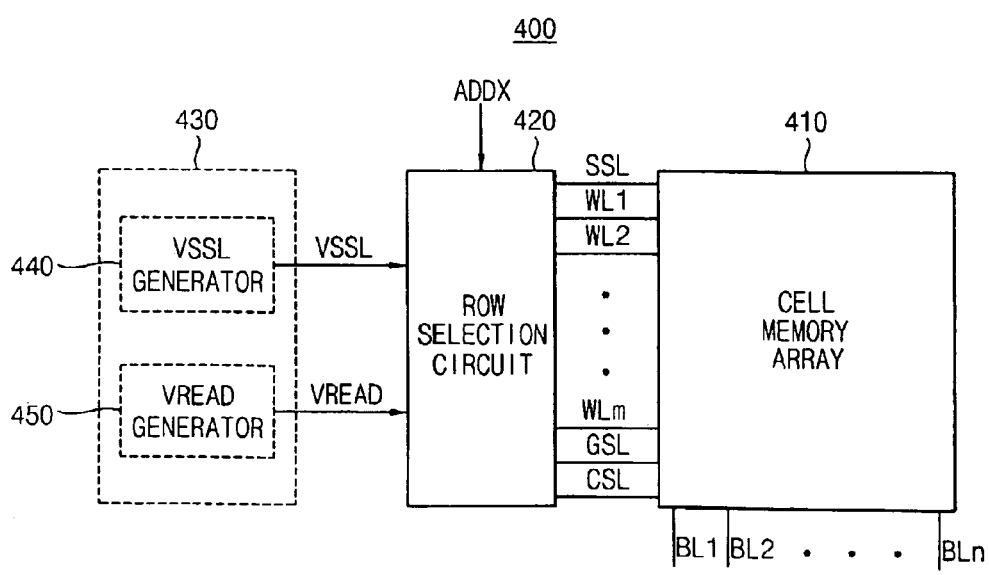
FIG. 4 is a block diagram illustrating a flash memory device, according to an example embodiment.

FIG. 4 is a block diagram illustrating a flash memory device, according to an example embodiment.

Referring to FIG. 4, the flash memory device 400 may include a memory cell array 410, a row selection circuit 420 and/or a voltage generation circuit 430. The flash memory device 400 may further include a page buffer block, a column selection circuit and/or a controller. However, the page buffer block, the column selection circuit and the controller may be the same or substantially the same as those discussed above with regard to FIG. 1, and well known to those skilled in the art. Therefore, these elements and a discussion thereof have been omitted for the sake of clarity and brevity.

The memory cell array 410 may include a plurality of NAND strings formed by a plurality of memory cells coupled in series between a string selection transistor and a ground selection transistor. The plurality of NAND strings may extend in a column direction. Each of the plurality of NAND string may include a plurality of memory cells coupled in series between the string selection transistor and the ground selection transistor. Memory cells in each respective NAND strings may be coupled to a common one of the plurality of word lines WL1 through WLm. A drain of each string selection transistor may be coupled to a corresponding one of bit lines BL1 through BLn extending in a column direction. A source of each ground selection transistor may be coupled to a common source line (CSL). During a read operation, for example, the string selection transistor may control an electrical connection between a NAND string and a corresponding bit line based on the string selection voltage VSSL.

In the conventional flash memory device of FIG. 1, a string selection transistor included in a memory cell array 100 may be turned on regardless of whether a read memory cell is programmed. In at least one example embodiment, the string selection transistor included in the memory cell array 400 of FIG. 4 may control an electrical coupling between the NAND string and a corresponding bit line according to whether the read memory cell is a programmed off-cell or non-programmed (e.g., erased) on-cell.

For example, the string selection transistor may be turned off to electrically separate or isolate the NAND string from the corresponding bit line when the read memory cell is a programmed off-cell. The string selection transistor may be turned on to electrically couple the NAND string with the corresponding bit line when the read memory cell is a non-programmed on-cell.

The row selection circuit 420 may be coupled to the memory cell array 410 through a string selection line SSL, a ground selection line GSL and/or a plurality of word lines WL1 through WLm. During an example read operation, the row selection circuit 420 may select the one of the plurality of word lines coupled to a read memory cell based on a row address signal ADDX and a read voltage VREAD. The voltage generation circuit 430 may generate the string selection voltage VSSL and the read voltage VREAD. Unlike the conventional flash memory device 100 of FIG. 1, the flash memory device 400 of FIG. 4, according to an example embodiment, may include a string selection voltage generator 440 and a read voltage generator 450.

Figure 5:
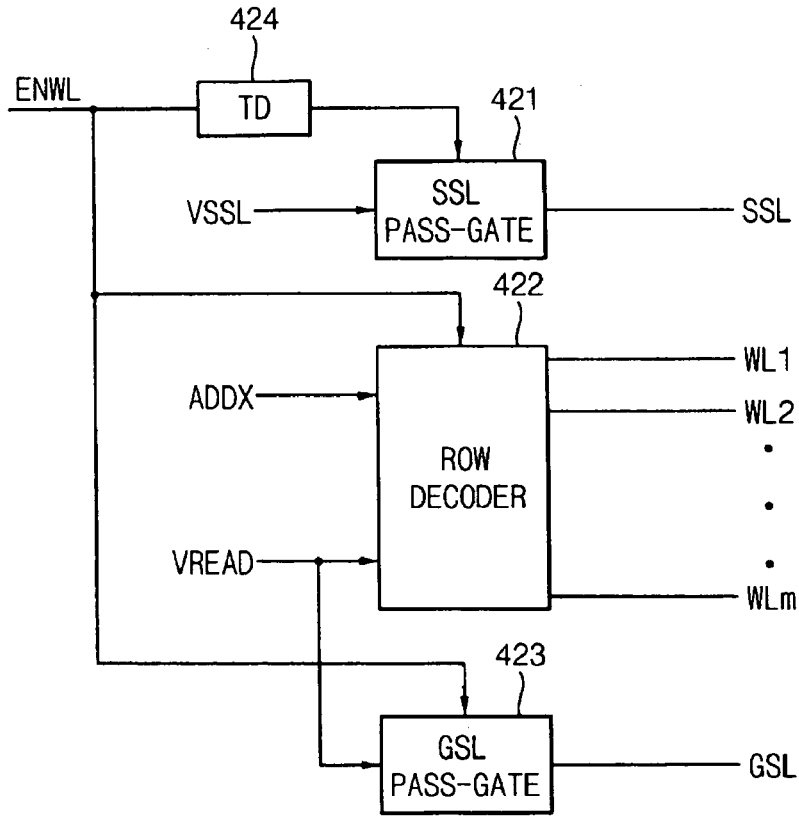
FIG. 5 is a block diagram illustrating a row selection circuit, according to an example embodiment.

FIG. 5 is a block diagram illustrating a row selection circuit, according to an example embodiment.

Referring to FIG. 5, the row selection circuit 420 may include a string selection pass gate 421, a row decoder 422, a ground selection pass gate 423 and/or a delay unit 424. The row selection circuit 420 may output a string selection voltage VSSL to the string selection line SSL after a delay time TD. The delay time TD may correspond to a time interval for stabilizing the bit line voltage and the read voltage applied to an unselected word line.

The ground selection pass gate 423 may output the read voltage VREAD to the ground selection line GSL in response to, for example, a word line enable signal ENWL. In this case, the NAND string may be electrically coupled to the common source line CSL because the ground selection transistor is turned on, a gate of which is coupled to the ground selection line GSL.

The row decoder 422 may output a ground voltage to a selected word line and the read voltage VREAD to an unselected word line in response to the word line enable signal ENWL and the row address signal ADDX.

The delay unit 424 may delay the word line enable signal ENWL by the delay time TD and output the delayed word line enable signal to the string selection pass gate 421. The string selection pass gate 421 may output the string selection voltage VSSL to the string selection line SSL in response to the delayed word line enable signal. According to example embodiments, the word line enable signal ENWL may be any control signal suitable for determining output time for selecting a word line during a read operation.

Figure 6:
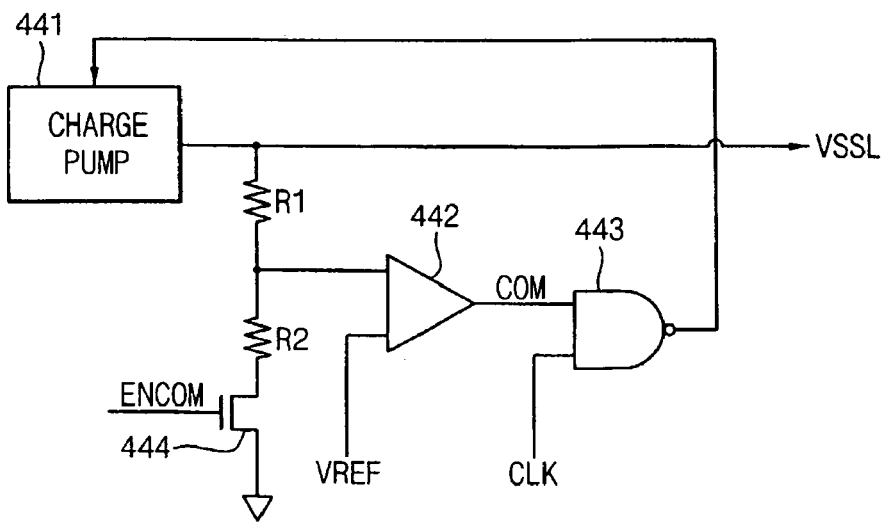
FIG. 6 is a block diagram illustrating a string selection voltage generator, according to an example embodiment.

FIG. 6 is a block diagram illustrating a string selection voltage generator, according to an example embodiment. Referring to FIG. 6, the string selection voltage generator 440 may include a charge pump 441, a comparator 442 and/or a logic unit 443. According to at least some example embodiments, the logic unit 443 may be a NAND gate.

The charge pump 441 may output the string selection voltage VSSL based on a control clock signal CTLCLK. The comparator 442 may generate a comparison signal COM based on the string selection voltage VSSL and a reference voltage VREF.

The logic unit 443 may output the control clock signal CTLCLK for controlling a voltage increasing operation of the charge pump 441 based on a clock signal CLK and the comparison signal COM.

In at least some example embodiments, the charge pump 441 may increase the output power in response to the clock signal CTLCLK to generate a higher or relatively high voltage. In FIG. 6, for example, the comparator 442 may output a comparison signal COM having a logic high level when the string selection voltage VSSL is lower than a reference value, and a logic low level when the string selection voltage VSSL is higher than the reference value. In this example, the logic unit 443 may include a NAND gate, and a control clock signal CTLCLK may have a logic level equal to the clock signal CLK when the string selection voltage VSSL is lower than the reference value and may maintain a logic low level when the string selection voltage VSSL is higher than the reference value. Accordingly, the charge pump 441 may maintain the string selection voltage VSSL with the reference value in response to the control clock signal CTLCLK.

As illustrated in FIG. 6, the string selection voltage VSSL output from the charge pump 441 may be divided according to a resistance ratio between resistors R1 and R2. The divided voltage may be provided to the comparator 442. In this example, the reference voltage VREF may be set up to, and including, a value obtained by multiplying the reference value of the string selection voltage with the resistance ratio. The reference voltage VREF may be provided as a mode register set (MRS) signal. An operation of the comparator 442 may be controlled by a control signal ENCOM applied to a gate of a transistor 444 that is coupled between the resistor R2 and ground.

Example operation of the flash memory device in FIG. 4 will be described in more detail with regard to FIGS. 7 and 8.

Figure 7:
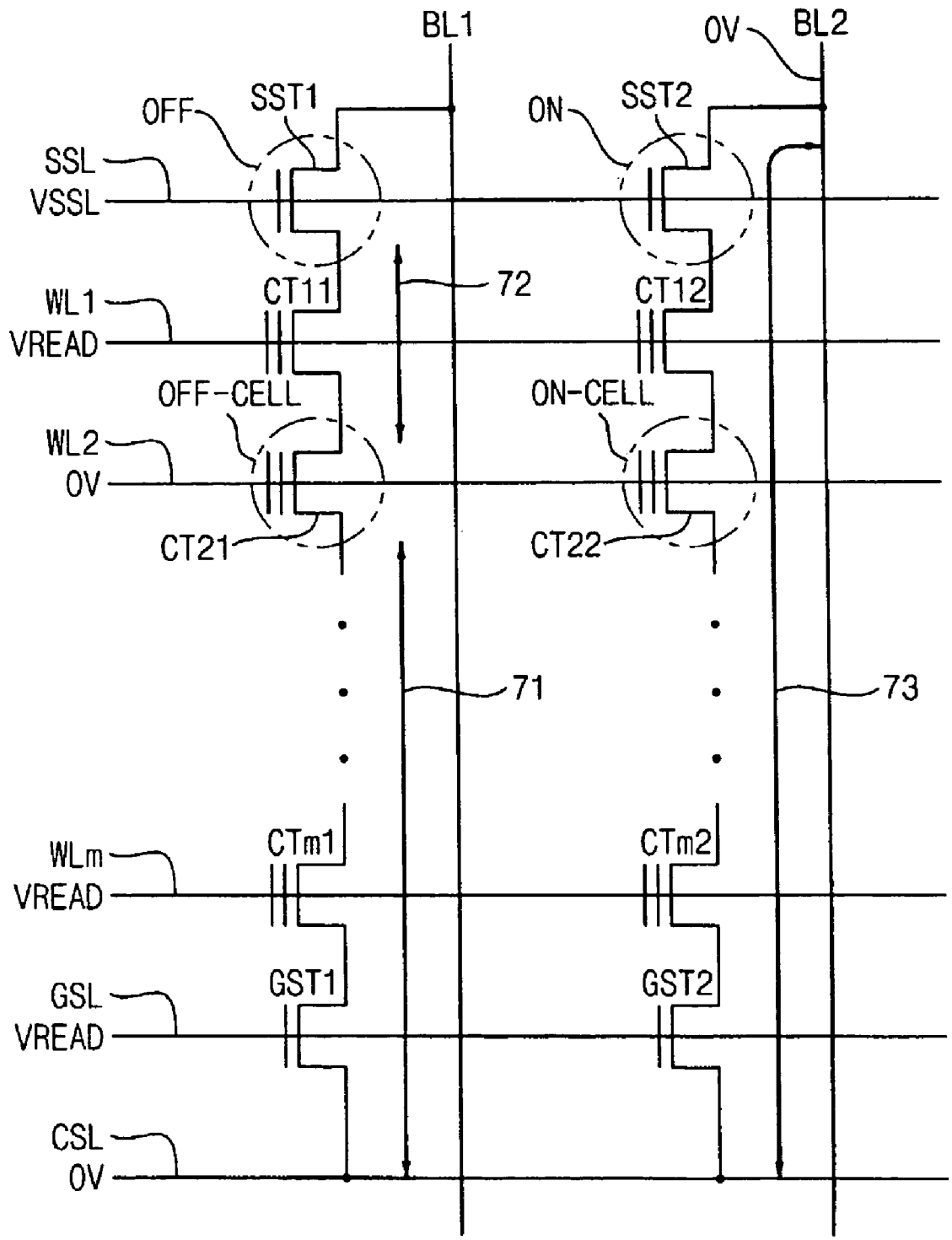
FIG. 7 is a circuit diagram of a NAND string for describing an example read operation of the flash memory device in FIG. 4.

FIG. 7 is a circuit diagram of a NAND string, according to an example embodiment. An example operation of the flash memory device in FIG. 4 will be described with regard to the NAND string of FIG. 7.

For the sake of clarity, only two NAND strings of a plurality of NAND strings are illustrated in FIG. 7 for describing a read operation. For example purposes, a read memory cell CT21 coupled to a selected word line WL2 is assumed to be a programmed off-cell and a read memory cell CT22 coupled to the same word line WL2 is assumed to be a non-programmed (e.g., erased) on-cell.

A memory cell array may be divided into a plurality of blocks and each block may include a plurality of NAND strings. The plurality of NAND strings may extend in a column direction, and may be arranged in a row direction within a single block. The plurality of NAND strings may be divided into odd NAND strings and even NAND strings. The odd and even NAND strings may operate alternately to suppress (e.g., prevent) interference between adjacent NAND strings. In this example, two NAND strings illustrated in FIG. 7 represent two even NAND strings (or two odd NAND strings).

To determine whether the read memory cells CT21 and CT22 are in a programmed or erased state, about 0V may be applied to a selected word line coupled to the read memory cells CT21 and CT22, and a read voltage VREAD may be applied to unselected word lines WL1 and WLm. In addition, the read voltage VREAD may be applied to the ground selection line GSL coupled to the gate of the ground selection transistor GST to electrically couple the NAND string to the common source line CSL.

Figure 2:
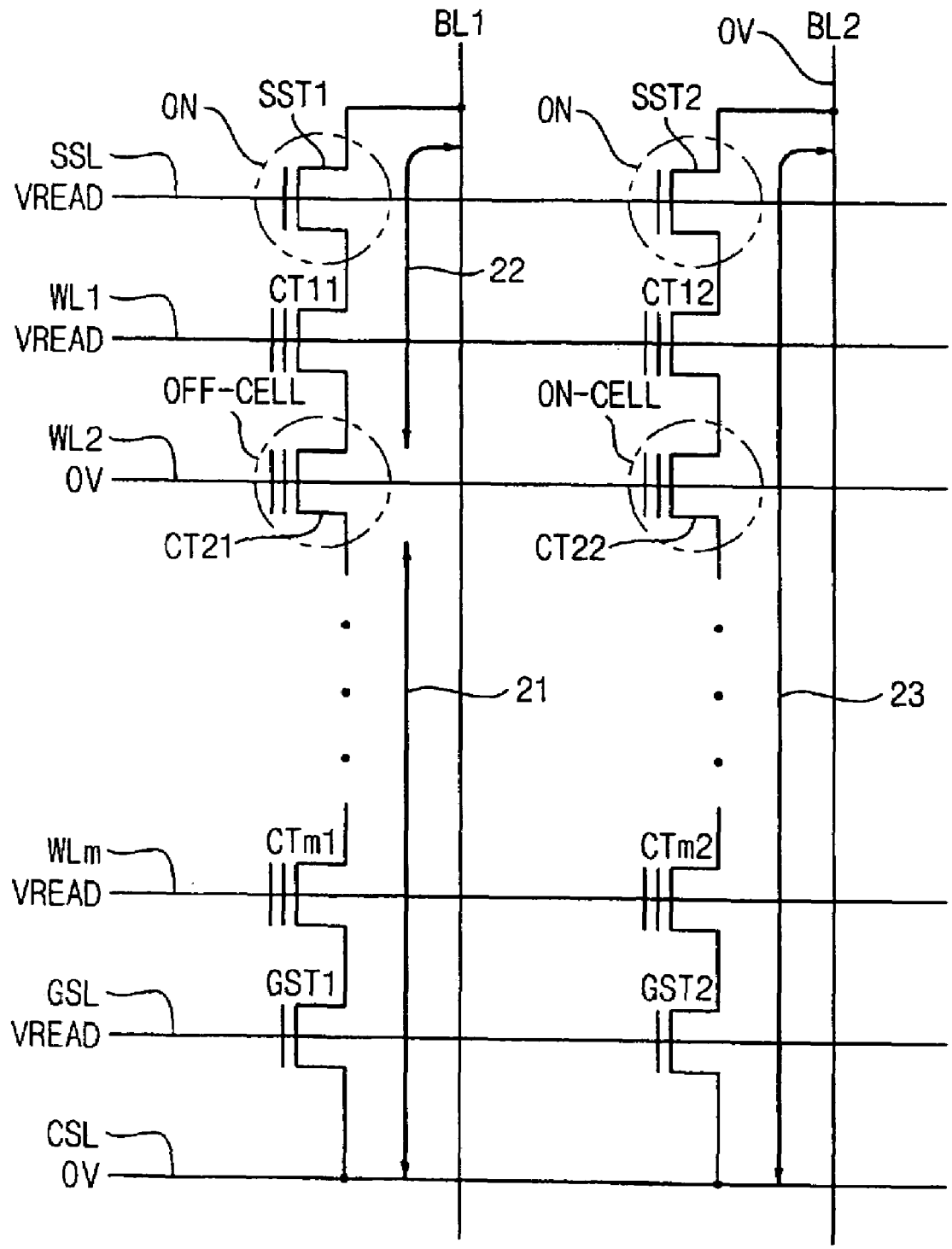
FIG. 2 is a circuit diagram of conventional NAND string for describing a read operation of the flash memory device in FIG. 1.
Figure 3:
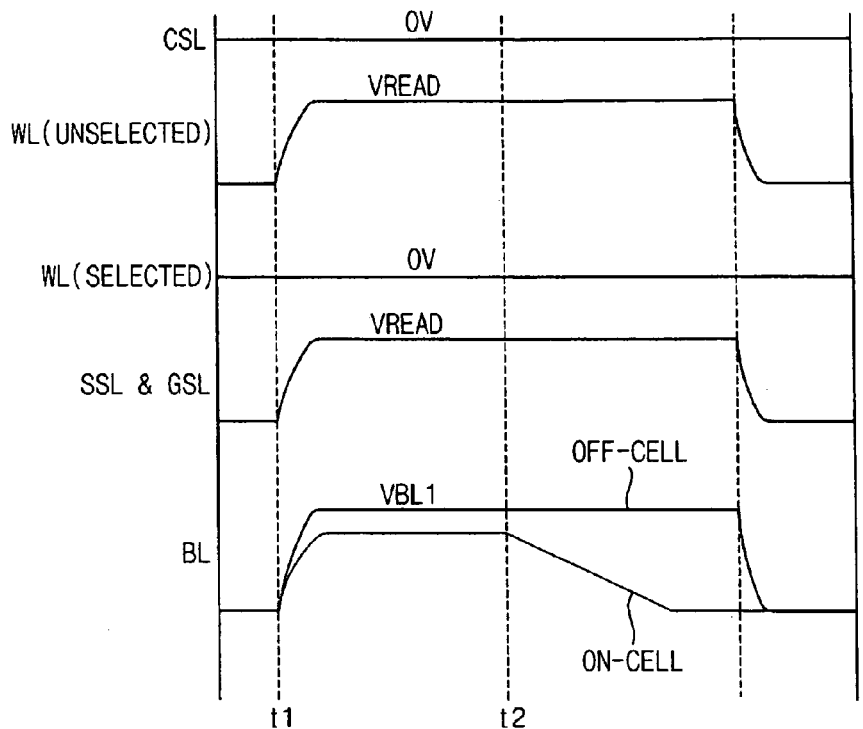
FIG. 3 is a diagram of voltage waveforms for describing a read operation of the conventional flash memory device of FIG. 1.

The read voltage VREAD may be applied to a gate of a string selection transistor in FIG. 2 and the string selection voltage VSSL may be applied to the gate of the string selection transistor in FIG. 7.

As illustrated in FIG. 7, when the read memory cell CT21 is a programmed off-cell, a transistor of the read memory cell CT21 may be turned off to electrically separate or isolate the drain from the source. In addition, the string selection transistor SST may also be turned off to electrically separate or isolate the drain from the source. Accordingly, a second path 72 between the read memory cell CT21 and the bit line BL1 may transition into a floating state. In this example, the second path may be an electrically conductive path including a drain, a source and a channel of the memory cells between the read memory cell CT21 and the bit line BL1. A voltage of a first path 71 between the read memory cell CT21 and the common source line CSL may become equal or substantially equal to a voltage of the common source line CSL (e.g., about 0V) because the ground selection transistor GST1 is turned on. The floating second path including a drain, a source and a channel of the memory cells between the read memory cell and the bit line may be charged to a boost voltage VBST when the read voltage VREAD is applied. The boost voltage VBST will be described in more detail with regard to FIG. 9.

With respect to the conventional NAND string shown in FIG. 2, in a read operation of the off-cell, the string selection transistor SST1 may be turned on to electrically couple the NAND string to the corresponding bit line. However, in the NAND string shown in FIG. 7, according to an example embodiment, the string selection transistor SST1 may be turned off to electrically separate or isolate the NAND string from the corresponding bit line. This may induce the boost voltage VBST in the channel of the memory cells between the read memory cell and the corresponding bit line.

When the read memory cell CT22 is a non-programmed (e.g., erased) on-cell, the cell transistor of the read memory cell CT22 may be turned on, and a channel electrically coupling the drain with the source of the read memory cell CT22 may be formed. In addition, both the string selection transistor SST and the ground selection transistor GST may be turned on. In at least this example embodiment, a third path 73 from the common source line CSL to the bit line BL2 may have a voltage equal or substantially equal to a voltage of the common source line CSL (e.g., about 0V).

Figure 8:
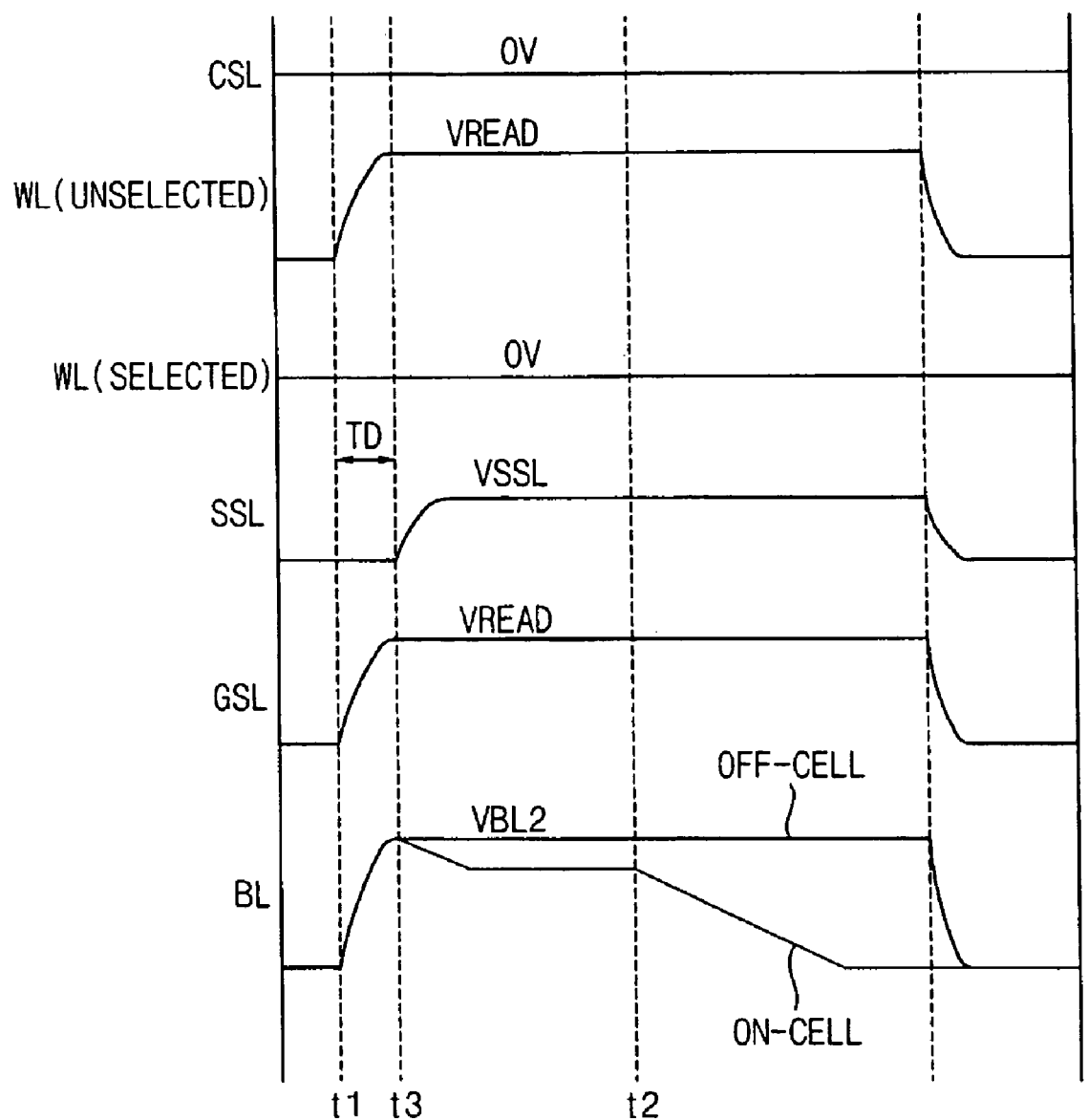
FIG. 8 is a diagram of voltage waveforms for describing another example read operation of the flash memory device in FIG. 4.

FIG. 8 is a diagram of voltage waveforms for describing an example read operation of a flash memory device, according to an example embodiment.

Referring to FIG. 8, for example, a ground voltage of about 0V may be applied to the common source line CSL and the selected word line. At time t1, the read voltage VREAD of about 4V to about 5V, inclusive, may be applied to the unselected word line. The read voltage VREAD may be applied to the gate of the ground selection transistor GST through the ground selection line GSL to electrically couple the NAND string to the common source line CSL.

The string selection voltage VSSL may be applied to the gate of the ground selection transistor GST through the string selection line SSL. The string selection voltage VSSL may be lower than a sum of the bit line voltage VBL2 and a threshold voltage of the string selection transistor SST1 to turn off the string selection voltage during a read operation of the off-cell.

As illustrated in FIG. 8, the string selection voltage VSSL may be applied to the gate of the string selection transistor SST through the string selection line SSL after a delay time TD. The delay time TD may correspond to a time needed for stabilizing the read voltage VREAD applied to the unselected word line and the bit line voltage VBL2.

Unlike the conventional flash memory device 100 of FIG. 1 in which the string selection transistor is turned on regardless of whether the read memory cell is programmed, in the flash memory device 400, according to an example embodiment, the string selection transistor may be turned off when the read memory cell is an off-cell and turned on when the read memory cell is an on-cell. Accordingly, the flash memory device 400 may electrically separate or isolate the NAND string from the corresponding bit line to induce the boost voltage, which may reduce read disturbance and/or error.

The boost voltage VBST of a channel and a state of the channel during a read operation, according to an example embodiment will be described in more detail with reference to the FIGS. 9 and 10.

Figure 9:
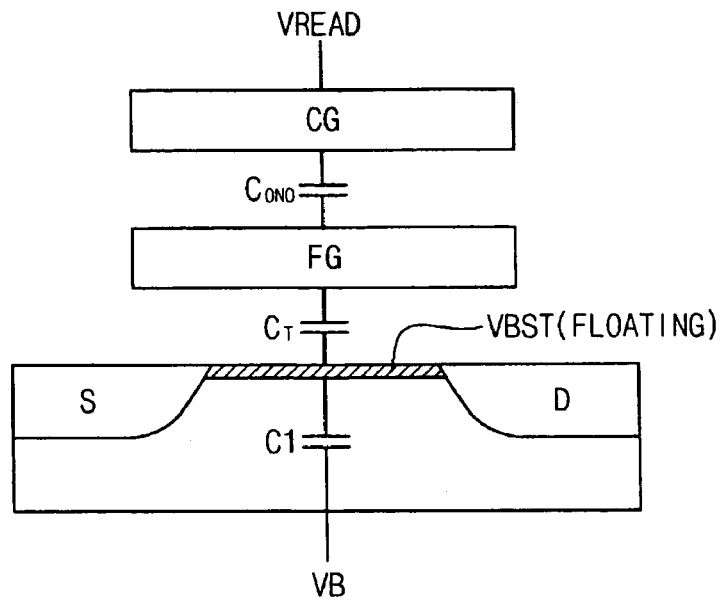
FIG. 9 and FIG. 10 are cross-sectional diagrams of a memory cell for describing a state of the channel during an example read operation of the flash memory device in FIG. 4.
Figure 10:
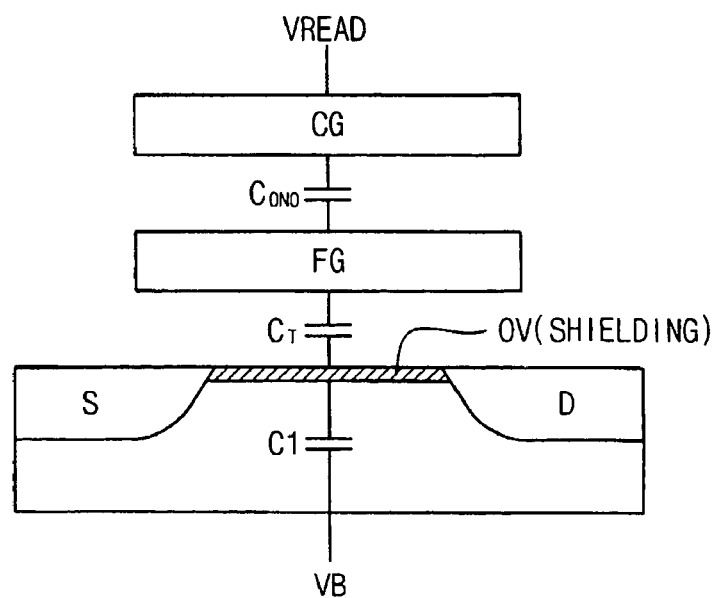

FIG. 9 and FIG. 10 are cross-sectional diagrams of a memory cell, according to an example embodiment. The state of the channel in an example read operation of the flash memory device in FIG. 4 will be described with regard to the memory cells of FIGS. 9 and 10.

Referring to FIG. 9; to form a memory cell, a source S and a drain D may be formed in an upper portion of a substrate. A control gate CG and a floating gate FG may be laminated over the substrate between the source S and the drain D. A dielectric layer such as, for example, ONO (oxide/nitride/oxide) layer may be deposited between the control gate CG and the floating gate FG, and a tunneling oxide layer may be deposited between the floating gate FG and the upper surface of the substrate. The dielectric layer and the tunneling oxide layer may have separate capacitances $C_{ONO}$ and $C_T$, respectively. Although example embodiments are described with respect to an ONO layer, the dielectric layer may be comprised of any suitable material having suitable dielectric characteristics.

When the read voltage VREAD is applied to the control gate CG, a channel may be formed beneath the upper surface of the substrate between the source S and the drain D. If a capacitance between the channel and the substrate, to which a substrate voltage VB is applied, is represented as C1 and an equivalent capacitance between the channel and the control gate CG is represented as C2, a coupling coefficient "r" may be calculated using Equation 1.

$$r = C2/(C1+C2)$$ [Equation 1]

Charge distribution of the floating gate may vary according to whether the memory cell is programmed. Accordingly, a coupling coefficient r1 of a programmed off-cell and a coupling coefficient r2 of an erased on-cell may be different from each other.

When the read voltage VREAD is applied to the gate of the memory cell through the unselected word line; drains, sources and channels of memory cells between the string selection transistor and the read memory cell may float and/or be charged to the boost voltage VBST represented by Equation 2, when the read memory cell is the off-cell.

$$VBST = VREAD \cdot (M \cdot r1 + N \cdot r2)/(M+N) \qquad [\text{Equation 2}]$$

In Equation 2, M and N represent the number of programmed on-cells and non-programmed off-cells, respectively, included in the second path 72, and r1 and r2 are respective coupling coefficients of the programmed on-cell and the non-programmed on-cell.

FIG. 9 illustrates a state of a channel in the memory cell between the off-cell and the string selection transistor during a read operation of an off-cell. As described above, the boost voltage VBST may be induced in the channel of the memory cell by the read voltage VREAD applied to the control gate CG Accordingly, a voltage difference between the floating gate FG and the channel may decrease, and thus, read disturbance may be reduced.

FIG. 10 illustrates a state of channel in memory cell coupled to the unselected word line during a read operation of an on-cell. In this example, the bit line voltage may be changed to a voltage of the common source line (e.g., about 0V) because the common source line is electrically coupled to the bit line by the NAND string, and the read memory cell may be identified as an on-cell by sensing a change in the bit line voltage.

Figure 11:
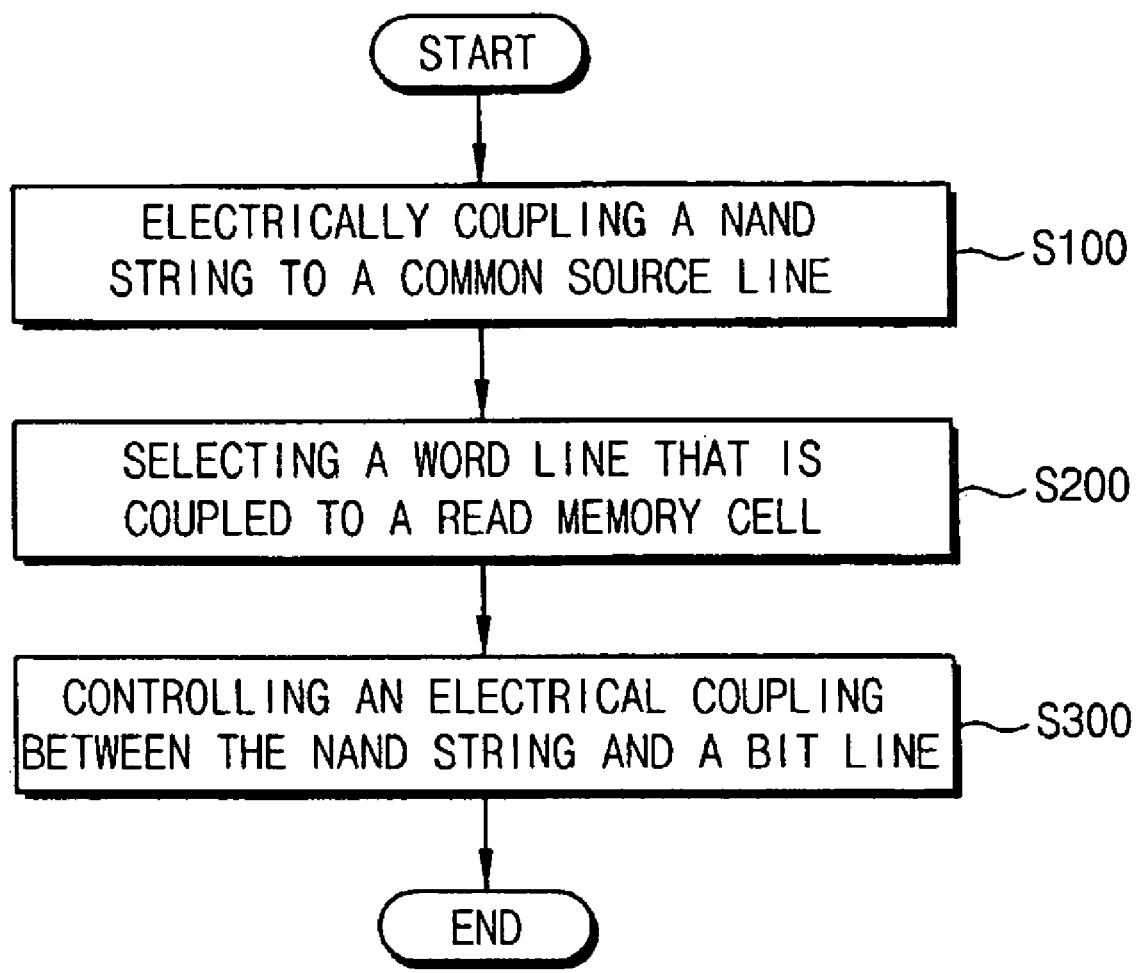
FIG. 11 is a flow chart illustrating a method of reading data in a flash memory device, according to an example embodiment.

FIG. 11 is a flow chart illustrating a method of operating a flash memory device, according to an example embodiment. The example embodiment shown in FIG. 11 may be used to read data stored in a flash memory device.

According to the method of FIG. 11, a NAND string, which may include a plurality of memory cells coupled in series between a string selection transistor and a ground selection transistor, may be electrically coupled to a common source line (S100). To electrically couple the NAND string to the common source line (S100), the read voltage may be applied to a gate of the ground selection transistor based on a word line enable signal.

A word line coupled to a read memory cell may be selected from the plurality of word lines based on a row address signal and a read voltage (S200). To select the word line coupled to the read memory cell (S200), a ground voltage may be output to a selected word line and the read voltage may be output to an unselected word line in response to the word line enable signal and the row address signal.

An electrical connection between the NAND string and a corresponding bit line may be controlled based on a string selection voltage (S300). Controlling the electrical connection between the NAND string and the bit line (S300) may include delaying the word line enable signal and applying the string selection voltage to the gate of the string selection transistor in response to the delayed word line enable signal. The word line enable signal may be delayed for a delay time for stabilizing the read voltage applied to the unselected word line and a bit line voltage for a read operation.

The string selection transistor may be turned off when the read memory cell is a programmed off-cell, and thus, the NAND string may be electrically separated or isolated from the bit line. This may suppress (e.g., prevent) a read disturbance by inducing a boost voltage in channels of memory cells between the read memory cell and the string selection transistor. When the read memory cell is a non-programmed on-cell, the NAND string may be electrically coupled to the bit line by turning on the string selection transistor.

To control a switching operation of the string selection transistor according to whether the read memory cell is programmed, the string selection voltage may be set lower than the read voltage. For example, the string selection voltage may be set lower than a sum of the bit line voltage and a threshold voltage of the string selection transistor.

After the delay time for stabilizing the read voltage applied to the unselected word line and the bit line voltage, the string selection voltage may be output to the string selection line.

As mentioned above, flash memory devices and/or methods of operating flash memory devices, according to at least some example embodiments, may reduce read disturbances and/or read errors by inducing a boost voltage in a channel of a memory cell by turning off a string selection transistor during a read operation.

The flash memory devices and methods of operating the same, according to at least some example embodiments, may suppress (e.g., prevent) the memory cell from deteriorating as a result of repeated read voltages and/or reduce a power consumption by setting the string selection voltage to a lower or relatively low voltage.

While example embodiments have been described in detail, it should be understood that various changes, substitutions and alterations may be made herein without departing from the scope of the present invention.

What is claimed is:

1. A flash memory device comprising:
   a memory cell array including at least one NAND string, each of the at least one NAND string including a plurality of memory cells coupled in series between a string selection transistor and a ground selection transistor, the string selection transistor being configured to control an electrical connection between a first of the at least one NAND string and a corresponding first bit line based on a string selection voltage and whether a memory cell selected during a read operation is programmed or non-programmed;
   a row selection circuit coupled to the memory cell array through a string selection line, a ground selection line and a plurality of word lines, the row selection circuit being configured to select a first of the plurality of word lines based on a row address signal and a read voltage, the first word line being coupled to a first memory cell; and
   a voltage generation circuit configured to generate the string selection voltage and the read voltage.

2. The flash memory device of claim 1, wherein the string selection transistor is configured to electrically isolate the first NAND string from the first bit line during the read operation when the first memory cell corresponds to a programmed off-cell.

3. The flash memory device of claim 1, wherein the string selection transistor is configured to electrically couple the first NAND string to the first bit line during the read operation when the first memory cell corresponds to a non-programmed on-cell.

4. The flash memory device of claim 1, wherein the string selection voltage is lower than the read voltage.

5. The flash memory device of claim 1, wherein the string selection voltage is lower than a sum of a bit line voltage for a read operation and a threshold voltage of the string selection transistor.

6. The flash memory device of claim 1, wherein the voltage generation circuit includes,
   a string selection voltage generator configured to generate the string selection voltage, and
   a read voltage generator configured to generate the read voltage.

7. A flash memory device comprising:
   a memory cell array including at least one NAND string, each of the at least one NAND string including a plurality of memory cells coupled in series between a string selection transistor and a ground selection transistor, the string selection transistor being configured to control an electrical connection between a first of the at least one NAND string and a corresponding first bit line based on a string selection voltage;
   a row selection circuit coupled to the memory cell array through a string selection line, a ground selection line and a plurality of word lines, the row selection circuit being configured to select a first of the plurality of word lines based on a row address signal and a read voltage, the first word line being coupled to a first memory cell; and
   a voltage generation circuit configured to generate the string selection voltage and the read voltage; wherein
   the row selection circuit Is configured to output the string selection voltage to the string selection line after a delay time for stabilizing the read voltage applied to unselected word lines except the first word line and the bit line voltage for a read operation.

8. A flash memory device comprising:
   a memory cell array including at least one NAND string, each of the at least one NAND string including a plurality of memory cells coupled in series between a string selection transistor and a ground selection transistor, the string selection transistor being configured to control an electrical connection between a first of the at least one NAND string and a corresponding first bit line based on a string selection voltage;
   a row selection circuit coupled to the memory cell array through a string selection line, a ground selection line and a plurality of word lines, the row selection circuit being configured to select a first of the plurality of word lines based on a row address signal and a read voltage, the first word line being coupled to a first memory cell; and
   a voltage generation circuit configured to generate the string selection voltage and the read voltage; wherein
   the row selection circuit includes,
      a ground selection pass gate configured to output the read voltage to the ground selection line in response to a word line enable signal,
      a row decoder configured to output a ground voltage to the first word line and output the read voltage to unselected word lines except the first word line in response to the word line enable signal and the row address signal,
      a delay unit configured to delay the word line enable signal by a delay time to output a delayed word line enable signal, and
      a string selection pass gate configured to output the string selection voltage to the string selection line in response to the delayed word line enable signal.

9. A flash memory device comprising:
   a memory cell array including at least one NAND string, each of the at least one NAND string including a plurality of memory cells coupled in series between a string selection transistor and a ground selection transistor, the string selection transistor being configured to control an electrical connection between a first of the at least one NAND string and a corresponding first bit line based on a string selection voltage;
   a row selection circuit coupled to the memory cell array through a string selection line, a ground selection line and a plurality of word lines, the row selection circuit being configured to select a first of the plurality of word lines based on a row address signal and a read voltage, the first word line being coupled to a first memory cell; and
   a voltage generation circuit, configured to generate the string selection voltage and the read voltage, the voltage generation circuit including a string selection voltage generator configured to generate the string selection voltage; wherein
   the string selection voltage generator includes,
      a charge pump configured to output the string selection voltage based on a control clock signal,
      a comparator configured to generate a comparison signal based on the string selection voltage and a reference voltage, and
      a logic unit configured to output the control clock signal based on a clock signal and the comparison signal.

10. The flash memory device of claim 9, wherein the reference voltage is set such that the string selection voltage is lower than a sum of a bit line voltage for a read operation and a threshold voltage of the string selection transistor.

11. A method of reading data in a flash memory device including at least one NAND string, each of the at least one NAND string including a plurality of memory cells coupled in series between a string selection transistor and a ground selection transistor, the method comprising:
   electrically coupling a first of the at least one NAND string to a common source line;
   selecting a first word line from the plurality of word lines based on a row address signal and a read voltage, the first word line being coupled to a first of the plurality of memory cells; and
   controlling an electrical connection between the first NAND string and a corresponding first bit line based on the string selection voltage and whether a memory cell selected during a read operation is programmed or non-programmed.

12. The method of claim 11, wherein controlling the electrical connection between the first NAND string and the first bit line includes,
   electrically isolating the first NAND string from the first bit line by turning off the string selection transistor during the read operation when the first memory cell corresponds to a programmed off-cell.

13. The method of claim 11, wherein controlling the electrical connection between the first NAND string and the first bit line includes,
   electrically coupling the first NAND string to the first bit line by turning on the string selection transistor during the read operation when the first memory cell corresponds to a non-programmed on-cell.

14. The method of claim 11, wherein the string selection voltage is lower than the read voltage.

15. The method of claim 11, wherein the string selection voltage is lower than a sum of a bit line voltage for a read operation and a threshold voltage of the string selection transistor.

16. A method of reading data in a flash memory device including at least one NAND string, each of the at least one NAND string including a plurality of memory cells coupled in series between a string selection transistor and a ground selection transistor, the method comprising:
- electrically coupling a first of the at least one NAND string to a common source line;
- selecting a first word line from the plurality of word lines based on a row address signal and a read voltage, the first word line being coupled to a first of the plurality of memory cells; and
- controlling an electrical connection between the first NAND string and a corresponding first bit line based on the string selection voltage; wherein
  - controlling the electrical connection between the first NAND string and the first bit line includes,
    - outputting the string selection voltage to the string selection line after a delay time for stabilizing the read voltage applied to unselected word lines except the first word line and the bit line voltage for a read operation.

17. A method of reading data in a flash memory device including at least one NAND string, each of the at least one NAND string including a plurality of memory cells coupled in series between a string selection transistor and a ground selection transistor, the method comprising:
- electrically coupling a first of the at least one NAND string to a common source line;
- selecting a first word line from the plurality of word lines based on a row address signal and a read voltage, the first word line being coupled to a first of the plurality of memory cells; and
- controlling an electrical connection between the first NAND string and a corresponding first bit line based on the string selection voltage; wherein
  - controlling the electrical connection between the first NAND string and the first bit line includes,
    - outputting the string selection voltage based on a control clock signal,
    - generating a comparison signal based on the string selection voltage and a reference voltage, and
    - outputting the control clock signal based on a clock signal and the comparison signal.

18. The method of claim 17, wherein the reference voltage is set such that the string selection voltage is lower than a sum of a bit line voltage for a read operation and a threshold voltage of the string selection transistor.

19. A method of reading data in a flash memory device including at least one NAND string, each of the at least one NAND string including a plurality of memory cells coupled in series between a string selection transistor and a ground selection transistor, the method comprising:
- electrically coupling a first of the at least one NAND string to a common source line;
- selecting a first word line from the plurality of word lines based on a row address signal and a read voltage, the first word line being coupled to a first of the plurality of memory cells; and
- controlling an electrical connection between the first NAND string and a corresponding first bit line based on the string selection voltage; wherein
  - electrically coupling the first NAND string to the common source line includes,
    - applying the read voltage to a gate of the ground selection transistor in response to a word line enable signal.

20. A method of reading data in a flash memory device including at least one NAND string, each of the at least one NAND string including a plurality of memory cells coupled in series between a string selection transistor and a ground selection transistor, the method comprising:
- electrically coupling a first of the at least one NAND string to a common source line;
- selecting a first word line from the plurality of word lines based on a row address signal and a read voltage, the first word line being coupled to a first of the plurality of memory cells; and
- controlling an electrical connection between the first NAND string and a corresponding first bit line based on the string selection voltage; wherein
  - selecting the first word line includes,
    - outputting a ground voltage to the first word line based on a word line enable signal and the row address signal, and
    - outputting the read voltage to unselected word lines except the first word line based on the word line enable signal and the row address signal.

21. A method of reading data in a flash memory device including at least one NAND string, each of the at least one NAND string including a plurality of memory cells coupled in series between a string selection transistor and a ground selection transistor, the method comprising:
- electrically coupling a first of the at least one NAND string to a common source line;
- selecting a first word line from the plurality of word lines based on a row address signal and a read voltage, the first word line being coupled to a first of the plurality of memory cells; and
- controlling an electrical connection between the first NAND string and a corresponding first bit line based on the string selection voltage; wherein
  - controlling the electrical coupling between the first NAND string and the first bit line includes,
    - delaying a word line enable signal for a delay time, the delay time being for stabilizing a bit line voltage for a read operation and the read voltage applied to unselected word lines except the first word line, and
    - applying the string selection voltage to a gate of the string selection transistor in response to the delayed word line enable signal.

* * * * *